(12) United States Patent
Wu et al.

(10) Patent No.: US 12,142,578 B2
(45) Date of Patent: Nov. 12, 2024

(54) STIFFENER RING COMBINED WITH ASIC POWER DELIVERY

(71) Applicant: Cisco Technology, Inc., San Jose, CA (US)

(72) Inventors: Xiaohong Wu, Santa Clara, CA (US); Xing Wang, Milpitas, CA (US); Mike Sapozhnikov, San Jose, CA (US); Sayed Ashraf Mamun, San Jose, CA (US); Tomer Osi, Rosh Ahayin (IL); Joel Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 630 days.

(21) Appl. No.: 17/492,836

(22) Filed: Oct. 4, 2021

(65) Prior Publication Data
US 2023/0104301 A1    Apr. 6, 2023

(51) Int. Cl.
| | |
|---|---|
| *H01L 23/50* | (2006.01) |
| *H01L 23/00* | (2006.01) |
| *H01L 23/053* | (2006.01) |
| *H01R 12/00* | (2006.01) |
| *H05K 1/18* | (2006.01) |
| *H05K 7/10* | (2006.01) |

(52) U.S. Cl.
CPC .......... *H01L 23/562* (2013.01); *H01L 23/053* (2013.01); *H01L 23/50* (2013.01); *H01R 12/00* (2013.01); *H05K 1/181* (2013.01); *H05K 7/10* (2013.01)

(58) Field of Classification Search
CPC .......................... H01L 23/562; H01L 23/053
See application file for complete search history.

(56) References Cited

U.S. PATENT DOCUMENTS

| | | | | |
|---|---|---|---|---|
| 5,895,967 | A * | 4/1999 | Stearns | H01L 24/49 |
| | | | | 257/E23.101 |
| 6,833,611 | B2 * | 12/2004 | Liu | H01L 23/50 |
| | | | | 257/E23.079 |
| 10,651,127 | B2 * | 5/2020 | Kong | H01L 24/16 |
| 2002/0153605 | A1 * | 10/2002 | Chang | H01L 23/49838 |
| | | | | 257/E23.079 |
| 2011/0140272 | A1 | 6/2011 | Zhao et al. | |
| 2019/0006294 | A1 | 1/2019 | Ong et al. | |
| 2019/0013303 | A1 | 1/2019 | Goh et al. | |
| 2019/0237371 | A1 | 8/2019 | Ahmad et al. | |
| 2020/0035593 | A1 | 1/2020 | Call et al. | |

* cited by examiner

*Primary Examiner* — Mukundbhai G Patel
(74) *Attorney, Agent, or Firm* — Edell, Shapiro & Finnan, LLC (57) ABSTRACT

An apparatus includes a printed circuit board (PCB), and an integrated circuit (IC) package connected with the PCB. The IC package includes a package substrate, a die secured to the package substrate and including an integrated circuit, and a stiffener ring secured to the package substrate and surrounding so as to define a perimeter around the die. The stiffener ring increases a rigidity of the package substrate and delivers electrical power to the integrated circuit, where the stiffener ring includes a first conductive layer forming a power (PWR) plane for the integrated circuit, a second conductive layer forming a ground (GND) plane for the integrated circuit, and an insulating layer disposed between the first conductive layer and the second conductive layer.

20 Claims, 12 Drawing Sheets

STIFFENER RING COMBINED WITH ASIC POWER DELIVERY

TECHNICAL FIELD

The present disclosure relates to providing structural support and power delivery for an integrated circuit.

BACKGROUND

To enable higher bandwidth for data centers and service provider systems, there is a need for high speed Serializer/Deserializer (SERDES) data transfer and delivery of very high current into an Application Specific Integrated Circuit (ASIC) pinfield. Some options that have been provided to enable such power delivery include designing a large orthogonal package (PKG) which must use a land grid array (LGA) socket. With this option, it is hard to deliver power into the ASIC pinfield and there is a large IR drop caused by the resistance from the LGA socket. Another option involves designing a smaller hex PKG with finer pitch in a ball grid array (BGA) configuration. However, this configuration leads to very fine "Swiss cheese" layering of the power (PWR) planes due to the hex pattern and finer pitch, leaving very small slivers of PWR and ground (GND) connections between the antipads. This also results in a large IR drop in the pinfield. Basically, current power deliver options for such systems suffer from large IR drops and power dissipation in the ASIC pinfields, which results in requiring higher layering requirements in the printed circuit board, greater manufacturing difficulties and cost as well as difficulties in providing adequate cooling for the ASIC.

BRIEF DESCRIPTION OF THE DRAWINGS

Like reference numerals have been used to identify like elements throughout this disclosure.

DESCRIPTION OF EXAMPLE EMBODIMENTS

Overview

An integrated circuit package comprises a printed circuit board (PCB), and an integrated circuit (IC) package connected with the PCB. The IC package comprises a package substrate, a die secured to the package substrate and including an integrated circuit, and a stiffener ring secured to the package substrate and surrounding so as to define a perimeter around the die. The stiffener ring increases a rigidity of the package substrate and delivers electrical power to the integrated circuit, where the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer.

In addition, an integrated circuit (IC) package comprises a package substrate, a die secured to the package substrate and including an integrated circuit, the die secured to the package substrate, and a stiffener ring secured to the package substrate and surrounding so as to define a perimeter around the die. the stiffener ring increases a rigidity of the package substrate and delivers electrical power to the integrated circuit, where the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer.

Further, a method comprises providing an integrated circuit (IC) package for a printed circuit board (PCB) of an electronic device, the IC package comprising a package substrate, a die including an integrated circuit, the die secured to the package substrate, and a stiffener ring secured to the package substrate and surrounding so as to define a perimeter around the die, where the stiffener ring increases a rigidity of the package substrate and delivers electrical power to the integrated circuit, and where the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer. The method further comprises_facilitating delivery of electrical power from a power source at the PCB to an IC component of the die via the PWR plane of the stiffener ring.

Example Embodiments

A package for an integrated circuit (IC), such as an Application Specific Integrated Circuit (ASIC), includes a stiffener ring that provides a dual purpose, increasing structural rigidity to the IC package (and thus enhanced protection for the IC components integrated with the package) and delivering high current electrical power to the IC during operations. The package is secured to a printed circuit board (PCB) for use in an electronic device or apparatus. As described herein, the stiffener ring comprises a plurality of layers, including very thin decoupling sub-layers arranged within an insulating layer or insulating layer disposed between a power (PWR) layer or PWR plane and a ground (GND) layer and GND plane of the stiffener ring that facilitates decoupling of the layers with low inductance on the package substrate. The stiffener ring configuration improves the DC and AC performance of the high current power delivery to the ASIC while reducing IR dissipation. By providing the power delivery within the stiffener ring in the manner described herein, this can result in a reduction in PCB layers otherwise required (e.g., when integrating power planes within the PCB), a potential reduction in number of PWR/GND balls otherwise required (e.g., in a BGA arrangement for an ASIC), and a further potential reduction in the size required for the package.

Figure 1:
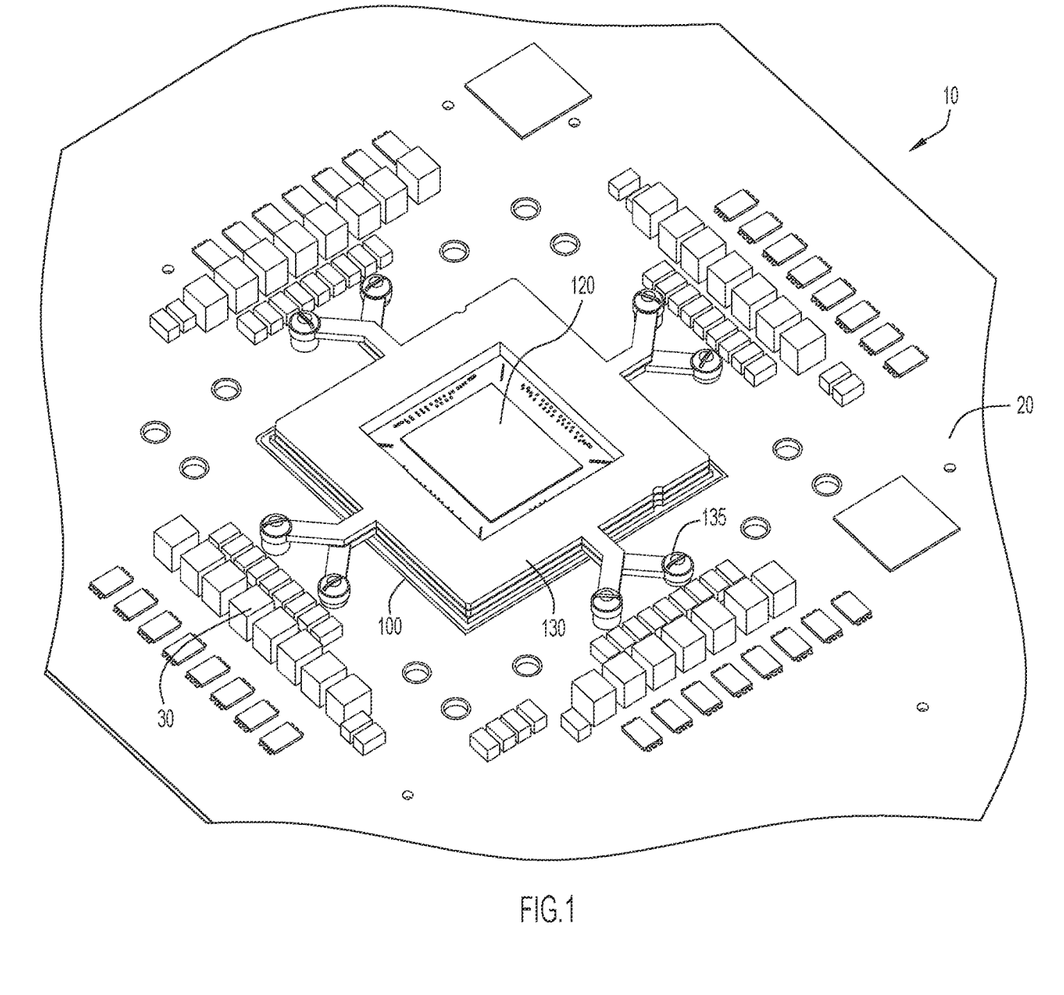
FIG. 1 a printed circuit board for an apparatus/device with an integrated circuit package and stiffener ring for the package with features as described herein.

Referring to FIG. 1, an example embodiment is depicted of a portion of an apparatus or electronic device 10 including a printed circuit board (PCB) 20 with electronic components 30 connected at a surface and/or at least partially integrated within the PCB. A package including a substrate 100 is connected at the PCB surface and includes a die 120 and a stiffener ring 130 disposed on the package substrate 100. The die 120 comprises a suitable semiconducting material with one or more integrated circuit (IC) components, such as an ASIC, connected and/or integrated with the die. The package substrate 100 further connects with the PCB 20 such that the IC components of the die connect or couple (e.g., via suitable vias and/or conductive traces) with IC and/or other electronic components of the PCB to facilitate transfer of signals there between during operation of the device. The electronic device 10 in which the PCB 20 is implemented can be any suitable electronic device that utilizes high speed communications (e.g., networking devices including routers, switches, etc.). One or more of the electronic components 30 of the PCB 20 can comprise a power source such as a voltage regulator module (VRM) that provides a suitable supply voltage to electronic components of the PCB including the die 120 for package.

The stiffener ring 130 comprises an annular member formed of a plurality of layers as described herein. In addition, as shown in FIG. 1, the stiffener ring 130 has a generally rectangular configuration with four sides that surround and define a border or perimeter around the die 120. However, the stiffener ring is not limited to having a rectangular shape with four sides but instead can have any suitable configuration (e.g., circular, oval, polygon shaped, irregular shaped, etc.) that defines an annular member or any semi-annular member (e.g., a C-shaped member) so as to completely surround or at least partially surround the die on the package substrate. As further described herein, arm portions that extend from the annular member of the stiffener ring 130 secure the stiffener ring to the package substrate 100 with suitable fasteners 135 (e.g., threaded screw members).

Figure 2A:
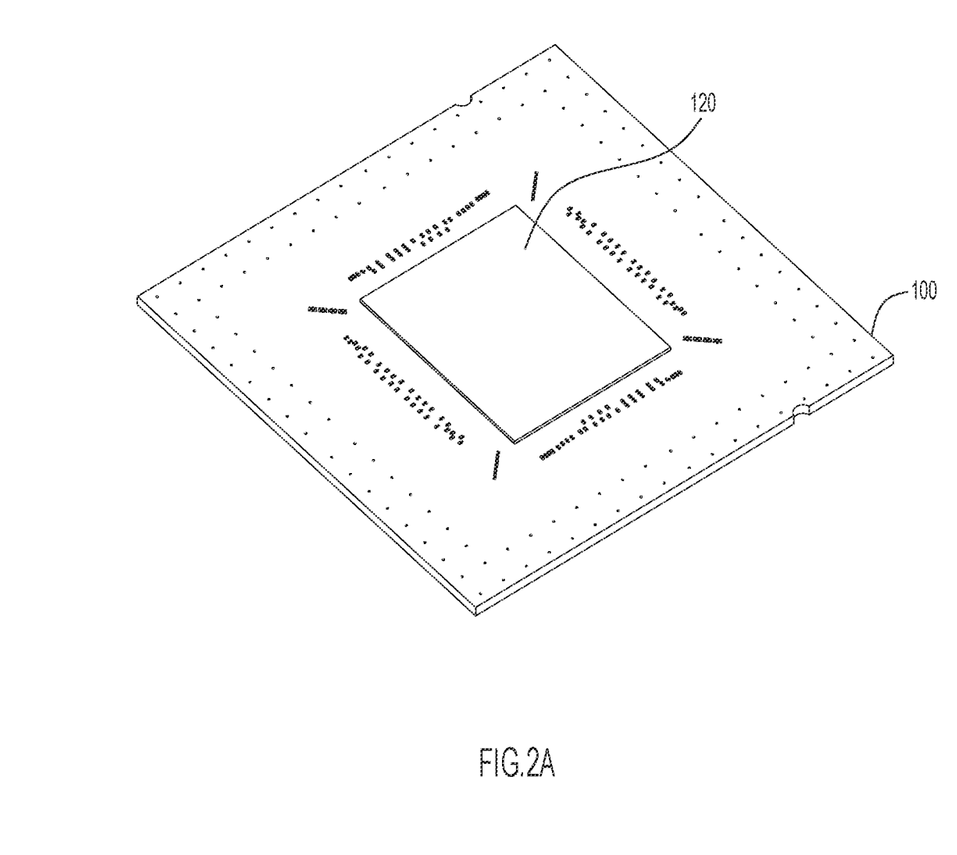
FIG. 2A depicts the package for the printed circuit board of FIG. 1 including a die prior to application of the stiffener ring to the package.
Figure 2B:
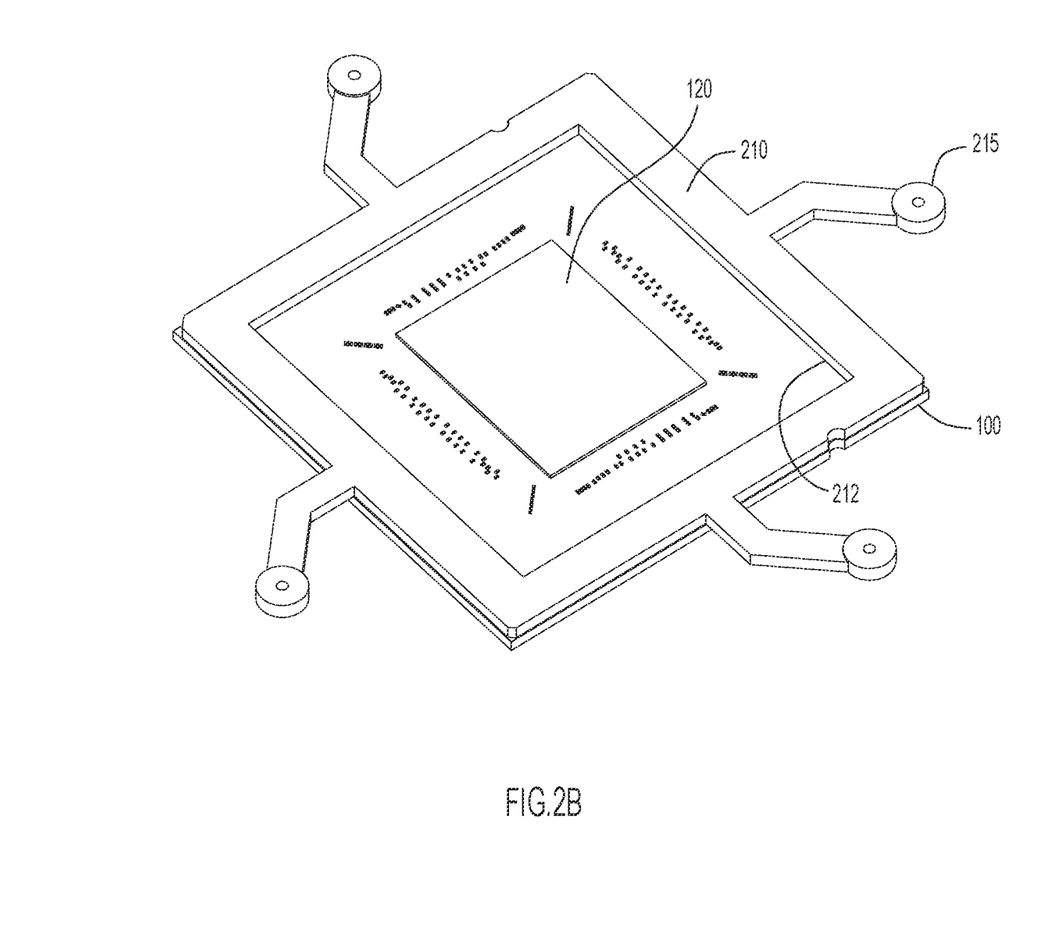
FIG. 2B depicts the package of FIG. 2A and further including a first conductive layer (power plane layer) of the stiffener ring applied to the package.

As shown in FIGS. 2A-2D, the stiffener ring 130 can be formed of a plurality of conductive and insulating structural layers arranged in a stacked manner in relation to each other and in relation to the mounting surface of the package substrate 100. The depiction of FIGS. 2A-2D shows a sequential build-up of the structural layers of the stiffener ring on the package substrate 100. In FIG. 2A, the package substrate 100 with ASIC die 120 is depicted without the stiffener ring present. In FIG. 2B, a first conductive layer 210 of the stiffener ring 130 is shown that is directly adjacent the mounting surface of the substrate 100. The first conductive layer 210 can comprise or be formed of copper or any other suitably rigid and electrically conductive material. The first conductive layer 210 further comprises an annular and rectangular member that defines the same or similar areal footprint of the stiffener ring engagement with the mounting surface of the package substrate. Each of the four sides of layer 210 includes a securing arm member 215 that extends transversely from its respective side and is fastened at a free end of the securing arm member 215 to the package substrate 100 via a suitable fastener 135 (e.g., a threaded screw member).

Figure 2C:
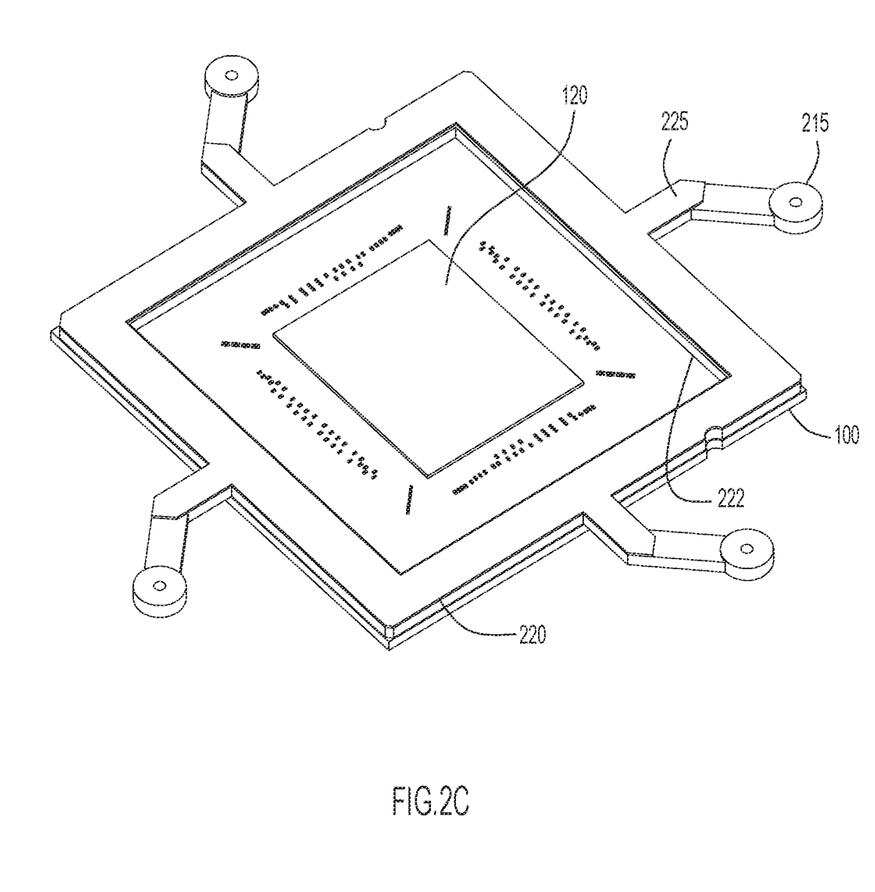
FIG. 2C depicts the package of FIG. 2B and further including an insulating layer of the stiffener ring applied to the package over the first conductive layer.

Referring to FIG. 2C, an insulating layer 220 overlies and engages with the first conductive layer 210 and includes the same or similar annular and rectangular shape and same or similar areal footprint as the first conductive layer over the mounting surface of the substrate 100. The insulating layer 220 includes interior annular side portions 222 (i.e., side portions that face toward the die 120) that overlie so as to cover the corresponding interior annular side portions 212 of the first conductive layer 210. The insulating layer 220 therefore extends to the mounting surface of the package substrate 100 at the interior annular side portions 222. The insulating layer 220 also includes an extending arm member 225 at each of its four sides, where each extending arm member protrudes transversely from its respective side and partially overlies a corresponding securing arm member 215 of the first conductive layer 210. The insulating layer comprises a suitable rigid and electrically insulating dielectric material (e.g., a combined fiberglass and organic resin material such as FR4, polytetrafluoroethylene, a ceramic material, a polyimide or any other suitably rigid plastic material, a ceramic material having a suitable dielectric constant, such as X7RB with DK=200, etc.). In addition, as described herein with reference to FIGS. 3-5, the insulating layer 220 includes a plurality of fine sub-layers formed within and/or as part of the insulating layer.

Figure 2D:
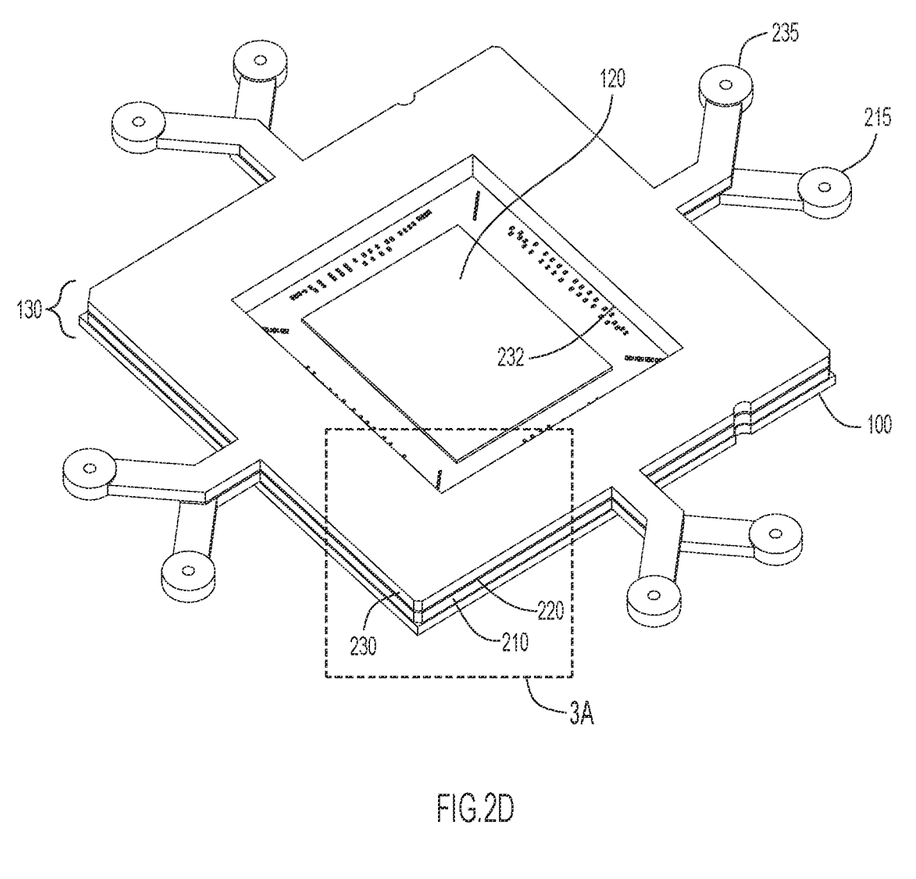
FIG. 2D depicts the package of FIG. 2C and further including a second conductive layer (ground layer) of the stiffener ring applied to the package over the insulating layer.

As shown in FIG. 2D, a second conductive layer 230, making up the final (outer) layer of the stiffener ring 130, overlies and engages with the insulating layer 220 and includes the same or similar annular and rectangular shape and same or similar areal footprint as the insulating layer and first conductive layer. The second conductive layer 230 includes interior annular side portions 232 (i.e., side portions that face toward the die 120) that overlie so as to cover the corresponding interior annular side portions 222 of the insulating layer 220. The second conductive layer 230 therefore extends to the mounting surface of the package substrate 100 at the interior annular side portions 232. Securing arm members 235 of the second conductive layer 230 extend transversely from corresponding sides of the second conductive layer and further overlie corresponding extending arm members 225 of the insulating layer 220. Each securing arm member 235 partially overlies but is separated (by the corresponding extending arm member 225) from a corresponding securing arm member 215 of the first conductive layer 210. The free end of each securing arm member 235 is further separated from the free end of the corresponding securing arm member 215 due to a bend provided in each securing arm member for the first conductive layer that opposes (i.e., extends in an opposite direction of) the bend of the other corresponding securing arm member of the second conductive layer. Each securing arm member 235 is secured at its free end to the package substrate 100 via a suitable fastener 135 (e.g., a threaded screw member). The second conductive layer 230 comprises an electrically conductive material that can be the same or similar material of which the first conductive layer 210 is formed (e.g., copper or any other suitably rigid and electrically conductive material).

The insulating layer 220 extends between and separates (so as to prevent any contacting engagement between) the first conductive layer 210 and the second conductive layer 230. The first and second conductive layers are further suitably oriented and connected with the package substrate 100 to facilitate electrical connection with a power source component (e.g., VRM) coupled with the package substrate 100 as well as with the electrical contacts (e.g., a pinfield) of the ASIC disposed at the die 120. As shown, e.g., in FIGS. 3-5, vias 105 are provided in the package substrate 100 that allow electrical contact with the first conductive layer 210 and the second conductive layer 230 to facilitate delivery of electrical power via the stiffener ring 130 to the ASIC. The electrical contact connections can be arranged such that the first conductive layer 210 functions as a power (PWR) plane and the second conductive layer 230 functions as a ground (GND) plane for the delivery of electrical power from the VRM at the PCB 20 to the ASIC on the die 120. The first conductive (PWR plane) layer 210 and the and second conductive (GND plane) layer 230 can have the same or similar thickness and can be in the range from about 1.0 mm to about 1.5 mm. The insulating layer 220 can be similar in thickness or differ in thickness from each of the first and second conductive layers. In some embodiments, the insulating layer 220 can have an overall thickness ranging from about 0.1 mm to about 0.15 mm.

Figure 3A:
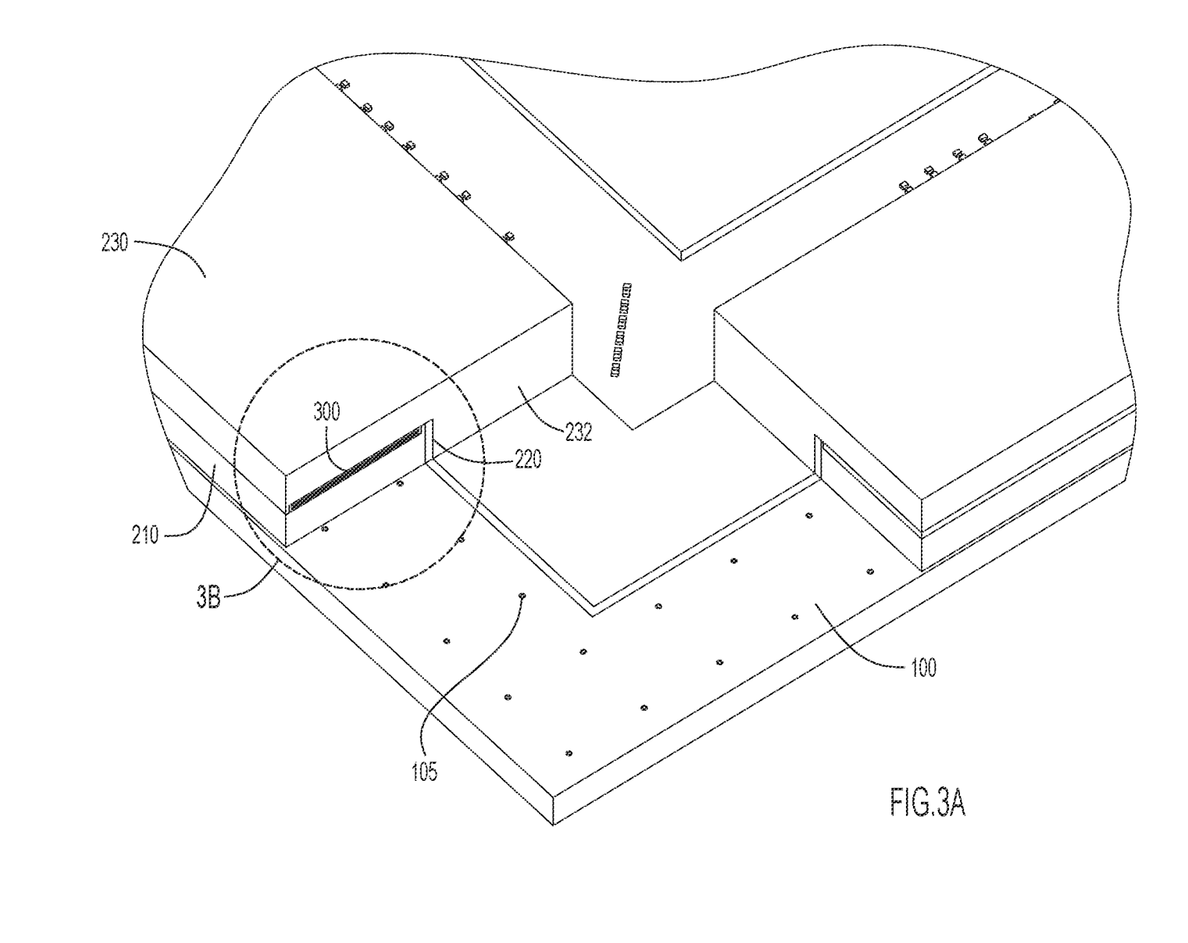
FIG. 3A depicts a portion of the package including a cut-out portion at a corner of the stiffener ring showing a cross-section of the stiffener ring including the first and second conductive layers and the insulating layer.
Figure 3B:
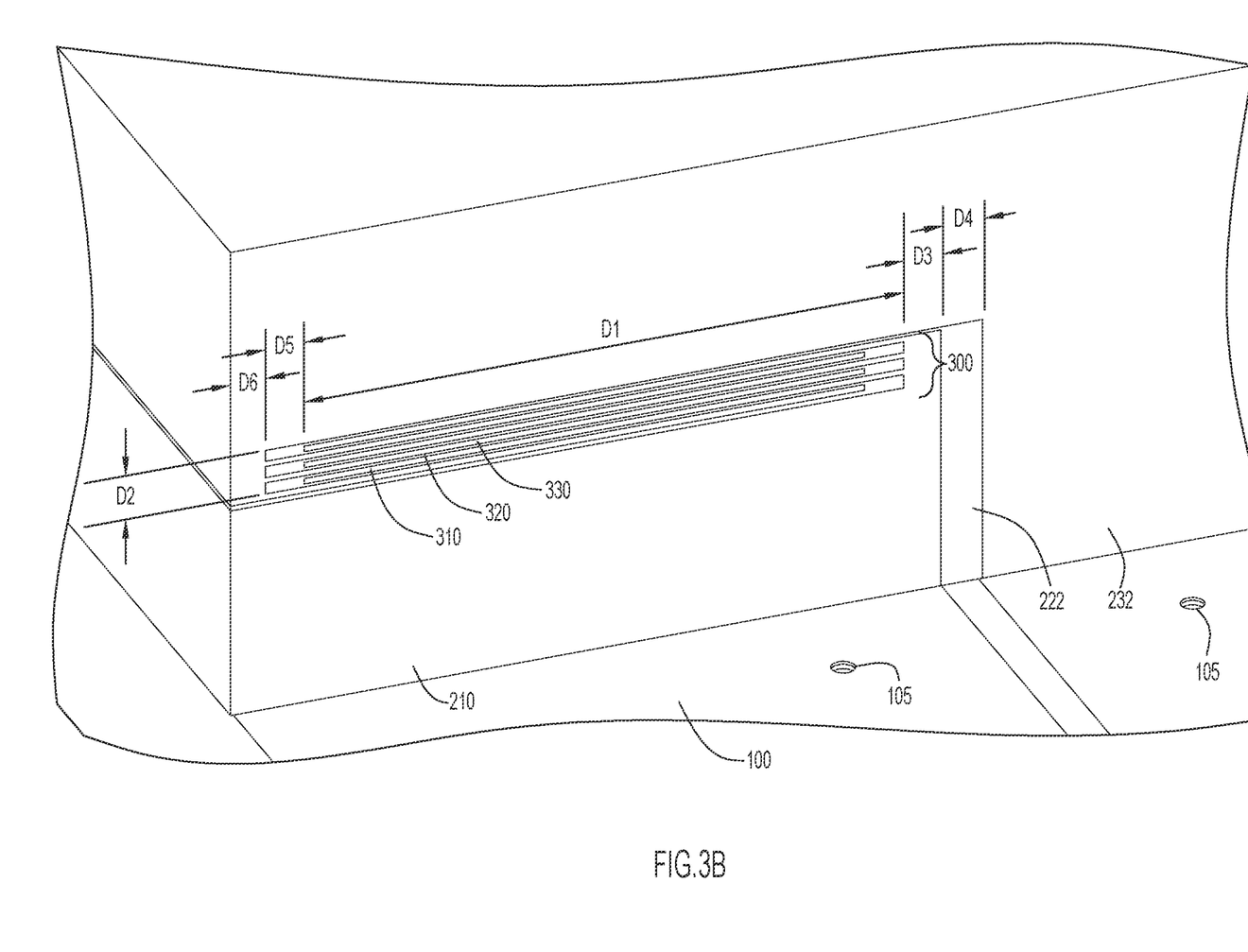
FIG. 3B depicts an enlarged view of the cross-section of the stiffener ring on the package of FIG. 3A, also showing an arrangement of a plurality of thin decoupling/sub-layers formed within the structure of the insulating layer of the stiffener ring.
Figure 3C:
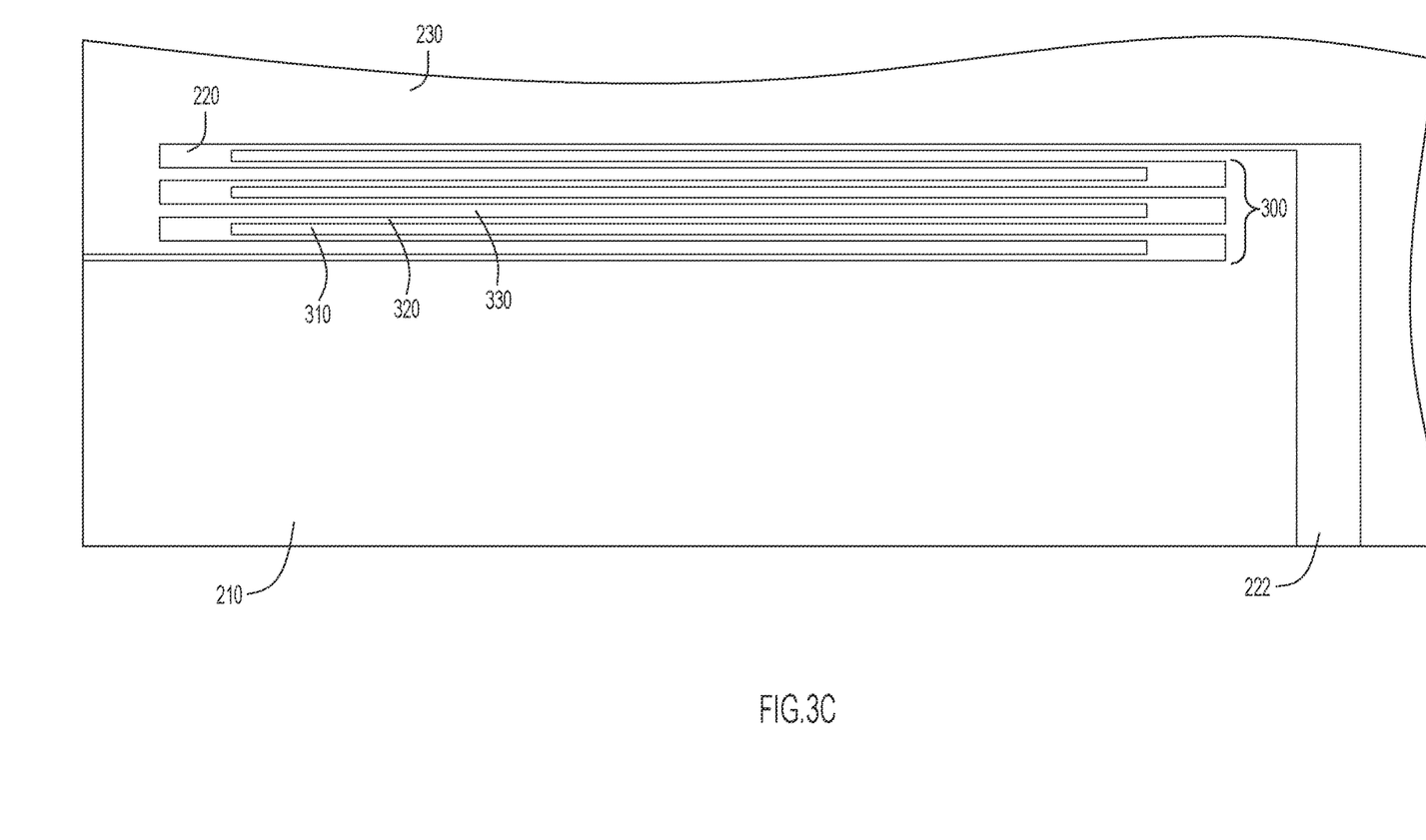
FIG. 3C depicts an enlarged view of a portion of the stiffener ring as shown in FIG. 3B.

An enlarged view of a portion of the stiffener ring 130 mounted on the package substrate 100 is shown in FIG. 3A, in which a corner section extending between two sides of the stiffener ring is cut-out or removed to show the arrangement of the first conductive (PWR plane) layer 210, the second conductive (GND plane) layer 230, and the insulating layer 220 as well as a decoupling section or layering section 300 of very thin decoupling sub-layers provided within the insulating layer 220. In the views of FIGS. 3B and 3C (further enlarged views of the stiffener ring portion along one side of the cut-out corner section), the layering section 300 includes a plurality of very thin sub-layers 310, a plurality of very thin sub-layers 320, and a plurality of very thin sub-layers 330, where each sub-layer 320 extends between alternating and consecutively aligned rows of sub-layers 310, 330 such that the sub-layers of the layering section 300 are consecutively arranged in rows as sub-layer 310, sub-layer 320, sub-layer 330, sub-layer 320, sub-layer 310, etc. The sub-layers 320 therefore are disposed between and separate pairs of sub-layer 310 and sub-layer 330. The sub-layers of the layering section 300 can extend continuously along the lengthwise dimension of any one or more sides (e.g., continuously along two or more sides, or continuously along all sides) of the stiffener ring 130. In addition, the sub-layers are oriented such that, when viewed along a cross-section that is transverse (e.g., orthogonal with) a lengthwise dimension of a side of the stiffener ring and also transverse the mounting surface of the package substrate 100 as shown in FIGS. 3A, 3B and 3C, the longer or lengthwise cross-sectional dimension of each sub-layer extends in a direction between inner and outer annular side surfaces of the stiffener ring and also generally corresponding (e.g., parallel) with the mounting surface of the package substrate.

Each sub-layer 310 extends to and connects at one of its ends with a conductive block portion that extends to and is continuous with the first conductive layer 210 at the inner annular side of the first conductive layer, while each sub-layer 330 extends to and connects at one of its ends with a conductive block portion that extends to and is continuous with the second conductive layer 230 at the outer annular side of the second conductive layer. The sub-layers 310 and sub-layers 330 are further formed of a suitable electrically conductive material (e.g., copper) and can be the same conductive material that forms the first and second conductive layers 210, 230. Accordingly, the sub-layers 310 are in electrical contact with the first conductive (PWR plane) layer 210, while the sub-layers 330 are in electrical contact with the second conductive (GND plane) layer 230.

Each sub-layer 320 connects at one of its ends with a consecutively aligned sub-layer 320 in a continuous manner so as to form a continuously connected and undulating insulating sub-layer structure that defines a torturous or winding path between each pair of sub-layer 310 and sub-layer 330, where the continuous insulating sub-layer structure formed by sub-layers 320 connects at one end with the interior annular side portion 222 of the insulating layer 220. The sub-layers 320 and overall continuous sub-layer structure formed of sub-layers 320 can comprise an electrically insulating material that can be the same as insulating layer 220. Thus, the continuous sub-layer structure defined by the connected insulating sub-layers 320 completely separates the alternating conductive sub-layers 310 and 320 from each other within the structure of the insulating layer 220.

The sub-layers 310, 320, 330 can be formed to have thicknesses in the range of only a few mils or less, e.g., a thickness of less than about 4 mils (about 102 micrometers), such as a thickness no greater than about 3 mils (about 76 micrometers), or a thickness no greater than about 2 mils (about 51 micrometers). The lengthwise dimensions of the sub-layers taken along the cross-section shown in FIGS. 3A-3C is represented by the dimension D1. In addition, the thickness dimension of the layering section 300 of sub-layers is represented by the dimension D2, the conductive block that extends to and connects with the first conductive layer 210 at its interior annular side portion has a thickness dimension D3, the inner annular side portion of the insulating layer 220 that extends beyond this conductive block has a thickness dimension D4, the connecting ends of the winding sub-layers 320 that extend beyond the lengths of the sub-layers 310 near the outer annular side portion of the stiffener ring have a length dimension D5, and the conductive block that extends to and connects with the second conductive layer 230 at the outer annular side portion of the second conductive layer has a thickness dimension D6. In a non-limiting example embodiment, D1 can be no greater than about 10 mm (e.g., about 7.25 mm), D2 can be less than about 1 mm (e.g., about 0.6 mm), and each of D2, D3, D4 and D5 can have the same or similar dimensions and be less than about 1 mm (e.g., about 0.5 mm). The insulating layer 220 can further be formed via any suitable process such that the layering section 300 of sub-layers, including one or both of the conductive block portions that connect sub-layers 310 with first conductive layer 210 and sub-layers 330 with second conductive layer 230, are incorporated as part of the insulating layer 220. This allows for ease of manufacture of the stiffener ring in combining the first conductive layer, insulating layer and second conductive layer together.

The arrangement of the first conductive (PWR plane) layer 210 of the stiffener ring 130 against the mounting surface of the package substrate 100 provides a large surface area to engage with vias and/or other electrical contacts (e.g., ASIC pinfield) to facilitate high DC and AC power delivery from the power source (VRM) of the PCB 20 to the ASIC on the die 120 with low IR power dissipation. In addition, the configuration of the stiffener ring layers, including the sub-layers 310, 320, 330 provided in the layering section 300 within the insulating layer 220 of the stiffener ring 130, provides a multilayered insulating layer between the PWR and GND planes that facilitates decoupling with low inductance at the package substrate.

While the embodiment of FIGS. 2A-2D and 3A-3C depict a stiffener ring including first and second conductive (PWR plane and GND plane) layers and an insulating layer including a layering section that extend continuously around the entire annular dimension or an entirety of the areal footprint defined by the perimeter of the stiffener ring (i.e., continuously around each side of the rectangular shaped stiffener ring), other embodiments can also be provided in which the first and second conductive layers and/or insulating layer with layering section extend continuously only a portion of areal footprint (e.g., continuously at least about 50% of the areal footprint of the stiffener ring, continuously along at least one side of the stiffener ring, continuously along at least two sides of the stiffener ring, etc.)

Figure 4A:
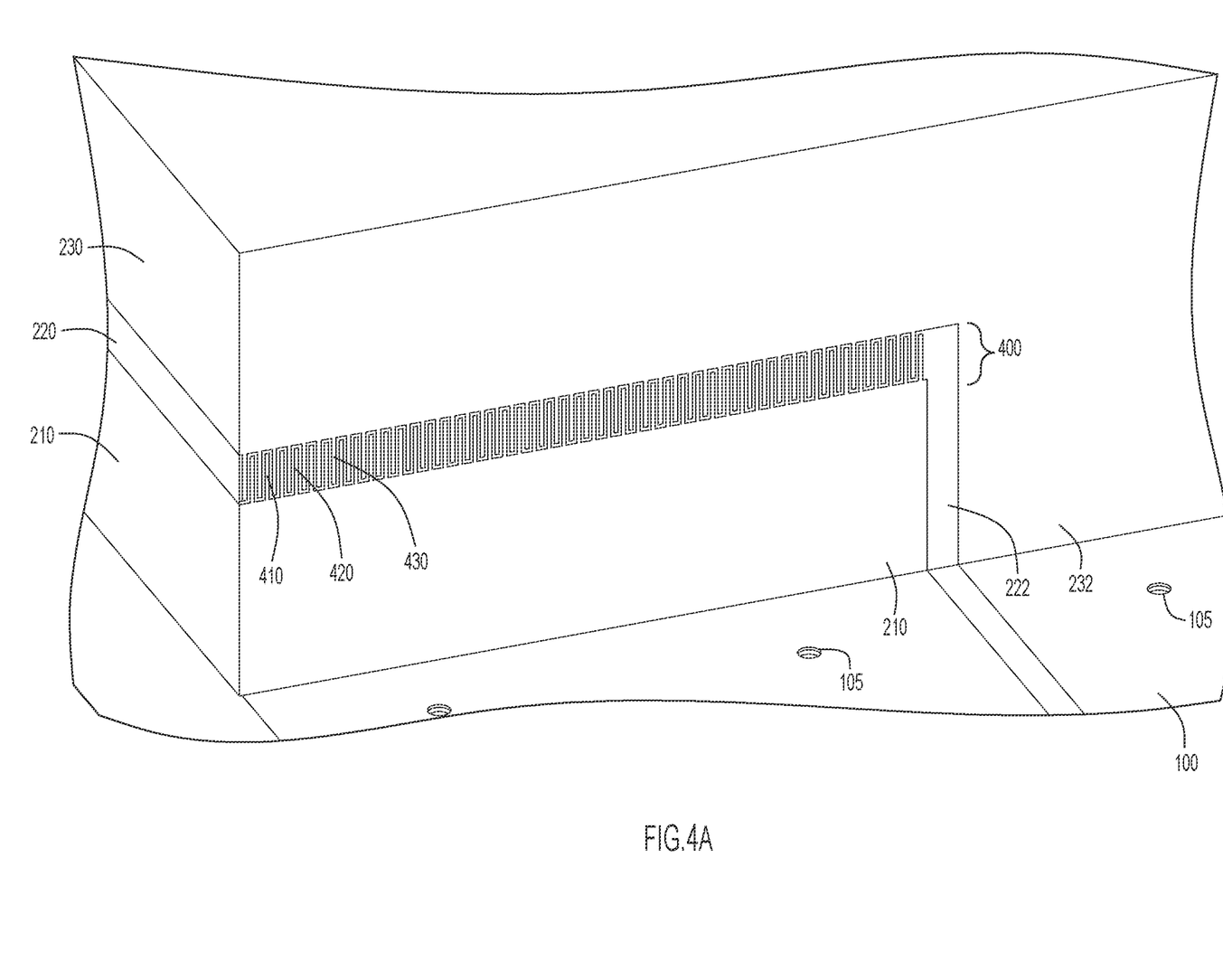
FIG. 4A depicts an enlarged view of the cross-section of the stiffener ring on the package of FIG. 3A, showing another embodiment of an arrangement of a plurality of thin decoupling/sub-layers formed within the insulating layer of the stiffener ring.
Figure 4B:
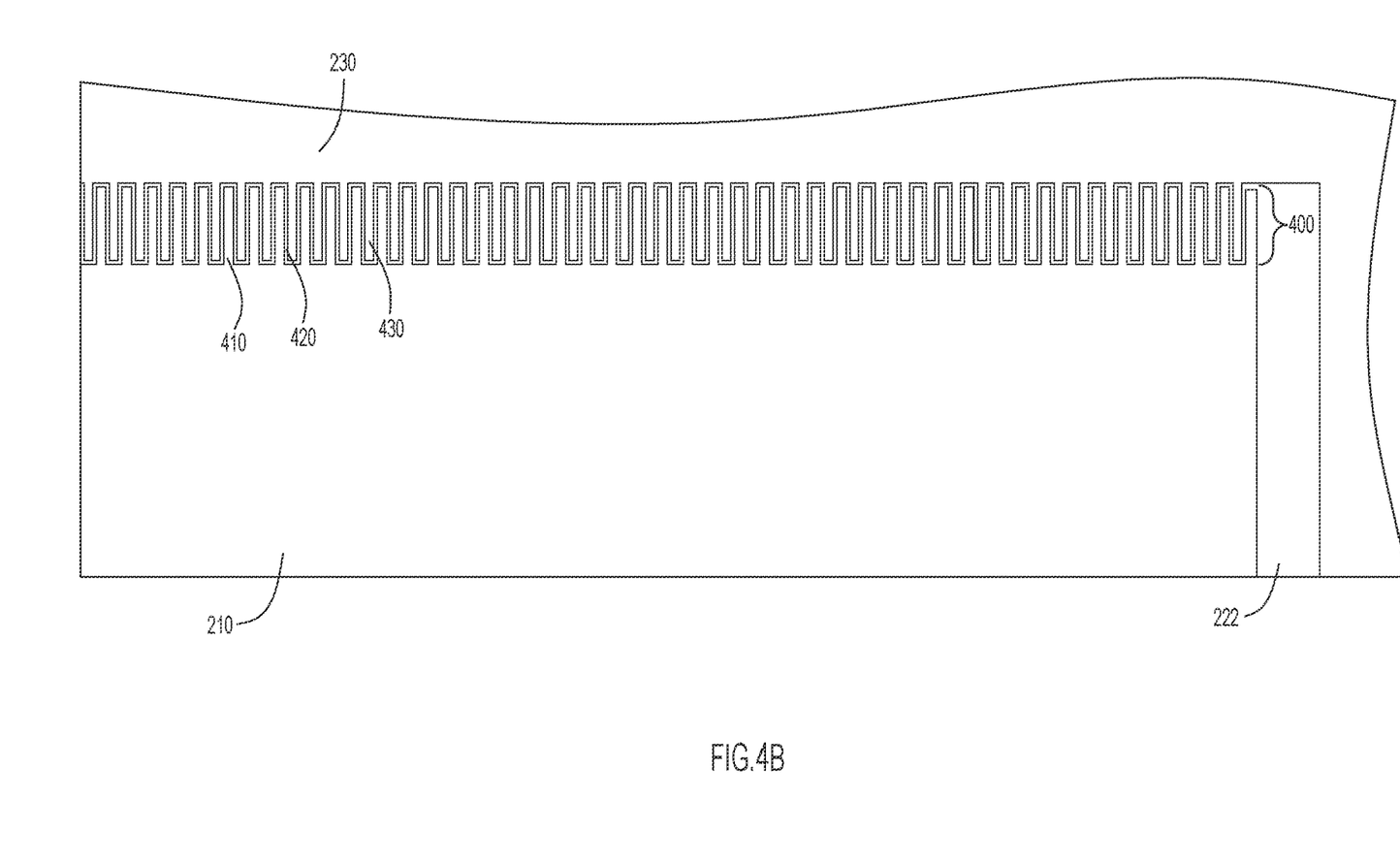
FIG. 4B depicts an enlarged view of a portion of the stiffener ring as shown in FIG. 4A.

In other embodiments, the layering section of sub-layers can be arranged in different orientations within the stiffener ring and still provide the same benefits for high power delivery, low power dissipation, and decoupling features. Referring to FIGS. 4A and 4B, another embodiment is depicted in which is provided a layering section 400 of sub-layers 410 (connected with the first conductive layer 210), sub-layers 430 (connected with the second conductive layer 230), and sub-layers 420 (connected with the insulating layer 220 and located between and completely separating alternating sub-layers 410 and sub-layers 430) within the structure of the insulating layer 220. The sub-layers 410 and 430 can be formed of the same or similar conductive materials as the first and second conductive layers, while the sub-layers 420 can be formed of the same or similar materials as the insulating layer. In this embodiment, the lengthwise dimensions of the sub-layers 410, 420, 430, when taken along a cross-section that is transverse the lengthwise side of the stiffener ring 130 and transverse the mounting surface of the package substrate 100, are arranged or oriented in a direction of the thickness of the stiffener ring (i.e., oriented in a direction that is transverse or orthogonal to each of the lengthwise dimension of the stiffener ring side and the mounting surface of the package substrate).

In each of the embodiments depicted in FIGS. 3A-3C and FIGS. 4A and 4B, the layering sections 300, 400 can have similar dimensions, with the first conductive (PWR plane) layer 210 and the second conductive (GND plane) layer 230 having similar thicknesses at locations on either side of the layering sections 300, 400.

Figure 5:
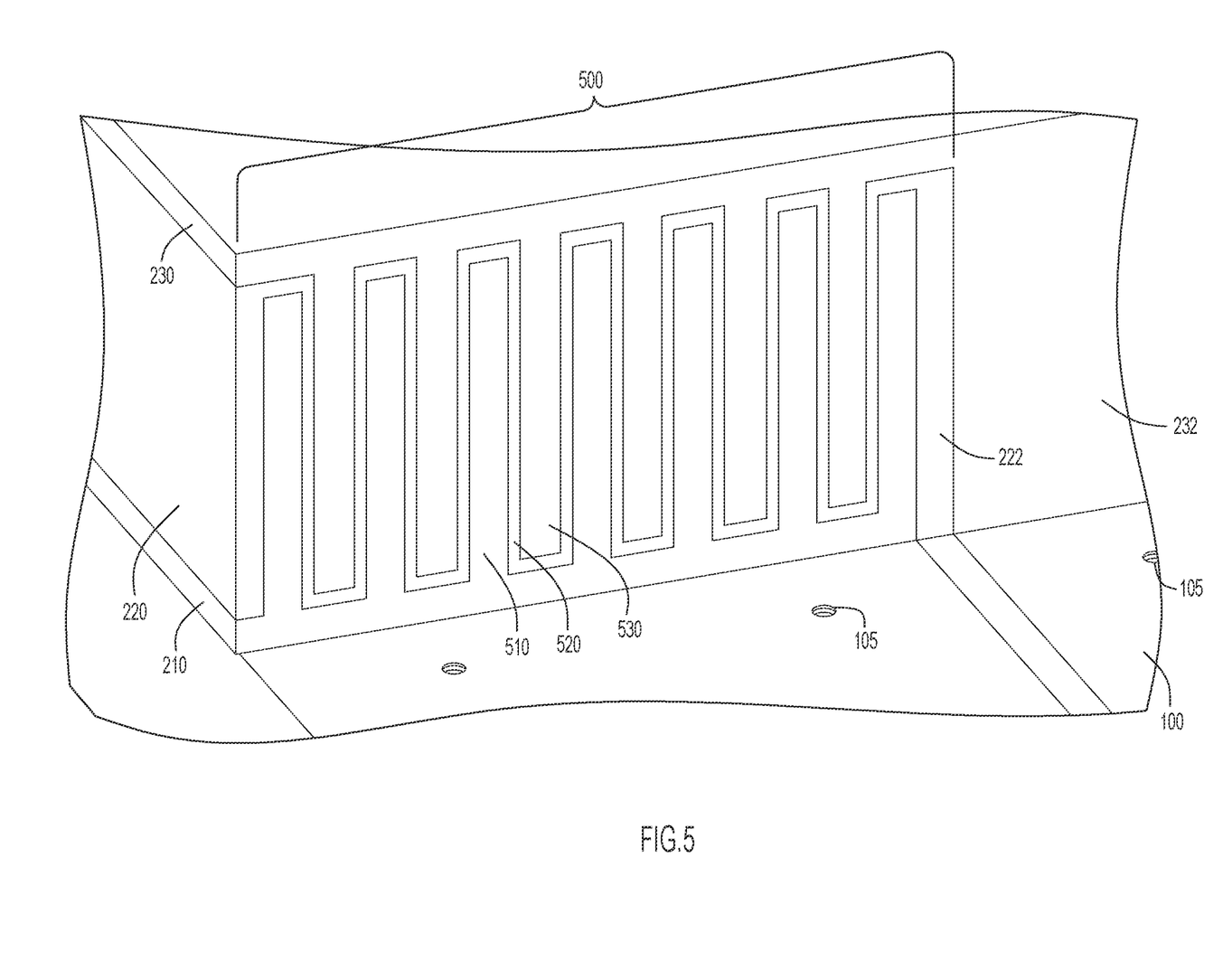
FIG. 5 depicts an enlarged view of the cross-section of the stiffener ring on the package of FIG. 3A, showing a further embodiment of an arrangement of a plurality of thin decoupling/sub-layers formed within the insulating layer of the stiffener ring.

In the further embodiment of FIG. 5, the layering section 500 of the insulating layer 220 has a similar configuration or orientation of sub-layers 510 (connected with and formed of the same or similar materials as the first conductive layer 210), sub-layers 530 (connected with and formed of the same or similar materials as the second conductive layer 230), and sub-layers 520 (connected with and formed of the same or similar materials as the insulating layer 220 and further located between and completely separating alternating sub-layers 510 and sub-layers 530). In other words, the lengthwise dimensions of the sub-layers 510, 520, 530, when taken along a cross-section that is transverse the lengthwise side of the stiffener ring 130 and transverse the mounting surface of the package substrate 100, are arranged or oriented in a direction of the thickness of the stiffener ring (i.e., oriented in a direction that is transverse or orthogonal to each of the lengthwise dimension of the stiffener ring side and the mounting surface of the package substrate). However, in the embodiment of FIG. 5, the sub-layers 510, 520, 530 of the layering section have greater length (and thickness) dimensions in relation to the length (and thickness) dimensions of the sub-layers 410, 420, 430 for the layering section 400 in the embodiment of FIGS. 4A and 4B. Further, the insulating layer 220 including layering section 500 has a greater thickness dimension than each of the first and second conductive layers 210, 230 at either side of layering section 500.

Figure 6:
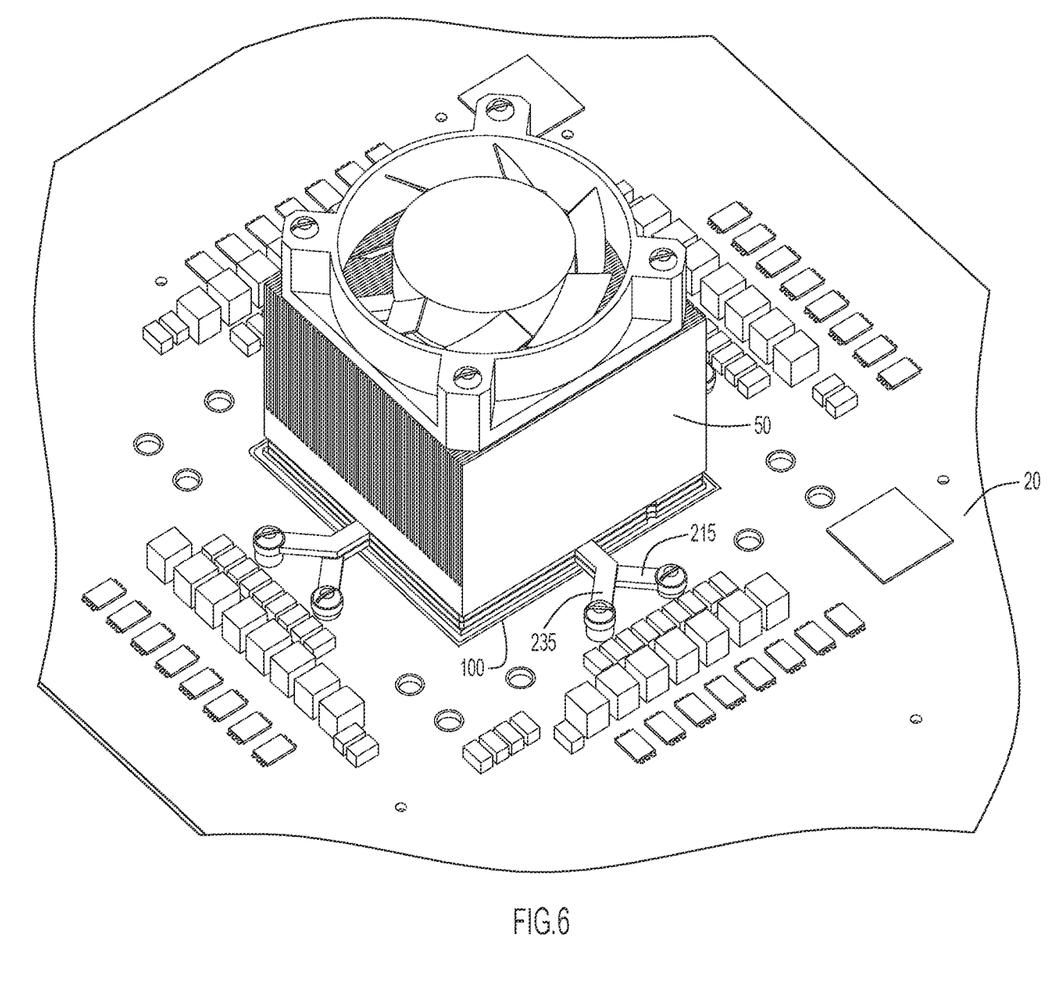
FIG. 6 depicts the printed circuit board of FIG. 1 including a heat sink disposed over the integrated circuit package.

The package substrate configuration with stiffener ring is further configured to facilitate ease of connection of a heat sink over the package die (e.g., ASIC die). As shown, e.g., in FIG. 6, a heat sink 50 can be provided directly over the stiffener ring 130 and die 120 of the package substrate 100 to facilitate effective heat transfer from and cooling of the die during device operations.

Each of the embodiments described herein provides a large contact surface area for the first conductive (PWR plane) layer 210 and the second conductive (GND plane) layer 230 incorporated into the stiffener ring for coupling with electrical contacts of the ASIC at the die 120 and the power source of the PCB 20 while further facilitating suitable decoupling at the package substrate surface. The layers of the stiffener ring provide suitable mechanical rigidity for the package substrate to maintain structural integrity for the IC components and for the electrical contacts between the IC components on the package die and components of the PCB. The stiffener ring in the embodiments described herein is further capable of delivering high current power to the ASIC and/or other components very close to the die of the package substrate while minimizing power dissipation. The power delivery from the stiffener ring can also be provided from top or bottom of the PCB and can be connected directly to the output of the power source (VRM) with a large power plane surface area connection and can further reduce the amount of PWR and GND contacts (e.g., BGA contacts), which can potentially result in a reduction in package size, and also minimize the amount of layers otherwise required for the PCB (since PWR and GND layers are effectively implemented within the stiffener ring).

Thus, example embodiments of an apparatus comprise a printed circuit board (PCB), and an integrated circuit (IC) package connected with the PCB. The IC package can comprise a package substrate, a die secured to the package substrate and including an integrated circuit, and a stiffener ring secured to the package substrate and surrounding so as to define a perimeter around the die. The stiffener ring increases a rigidity of the package substrate and delivers electrical power to the integrated circuit, where the stiffener ring can comprise a first conductive layer forming a power (PWR) plane for the integrated circuit, a second conductive layer forming a ground (GND) plane for the integrated circuit, and an insulating layer disposed between the first conductive layer and the second conductive layer.

Each of the first conductive layer, second conductive layer and insulating layer of the apparatus can extend continuously along at least about 50% of an areal footprint defined by the perimeter of the stiffener ring around the die. For example, each of the first conductive layer, second conductive layer and insulating layer can extend continuously along an entirety of the areal footprint defined by the perimeter of the stiffener ring around the die. Further, the stiffener ring can have a polygon (e.g., rectangular) shape, and each of the first conductive layer, second conductive layer and insulating layer can extend along at least one side, or at along at least two sides, of the stiffener ring.

The apparatus can further comprise a layering section provided within the insulating layer, the layering section comprising a plurality of first conductive sub-layers connected with the first conductive layer, a plurality of second conductive sub-layers connected with the second conductive layer and aligned in consecutively alternating rows with the first conductive sub-layers, and a plurality of insulating sub-layers connected with the insulating layer and located between so as to separate the consecutively alternating rows of the first conductive sub-layers and the second conductive sub-layers. The consecutive rows of the insulating sub-layers can be connected to form a continuously extending insulating sub-layer structure that defines a winding path between pairs of consecutively aligned first and second conductive sub-layers. In addition, each of the first conductive sub-layers, the second conductive sub-layers and the insulating sub-layers can have a lengthwise dimension that extends parallel with a mounting surface of the package substrate upon which the stiffener ring is secured. Alternatively, each of the first conductive sub-layers, the second conductive sub-layers and the insulating sub-layers can have a lengthwise dimension that extends transverse a mounting surface of the package substrate upon which the stiffener ring is secured.

The first conductive layer of the apparatus can be electrically coupled with a power supply of the PCB.

A networking device can be providing which comprises the apparatus described herein.

In other embodiments, an integrated circuit (IC) package can comprise a package substrate, a die secured to the package substrate and including an integrated circuit, and a stiffener ring secured to the package substrate and surrounding so as to define a perimeter around the die, The stiffener ring increases a rigidity of the package substrate and delivers electrical power to the integrated circuit, where the stiffener ring can comprise a first conductive layer forming a power (PWR) plane for the integrated circuit, a second conductive layer forming a ground (GND) plane for the integrated circuit, and an insulating layer disposed between the first conductive layer and the second conductive layer.

Each of the first conductive layer, second conductive layer and insulating layer of the IC package can extend continuously along at least about 50% of an areal footprint defined by the perimeter of the stiffener ring around the die. For example, each of the first conductive layer, second conductive layer and insulating layer of the IC package can extend continuously along an entirety of the areal footprint defined by the perimeter of the stiffener ring around the die. The stiffener ring of the IC package can further have a polygon shape, and each of the first conductive layer, second conductive layer and insulating layer can extend along at least one side, or at least along two sides, of the stiffener ring.

The IC package can further comprise a layering section provided within the insulating layer, the layering section comprising a plurality of first conductive sub-layers connected with the first conductive layer, a plurality of second conductive sub-layers connected with the second conductive layer and aligned in consecutively alternating rows with the first conductive sub-layers, and a plurality of insulating sub-layers connected with the insulating layer and located between so as to separate the consecutively alternating rows of the first conductive sub-layers and the second conductive sub-layers. Consecutive rows of the insulating sub-layers can be connected to form a continuously extending insulating sub-layer structure that defines a winding path between pairs of consecutively aligned first and second conductive sub-layers.

In further embodiments, a method can comprise providing an integrated circuit (IC) package for a printed circuit board (PCB) of an electronic device, where the IC package comprises a package substrate, a die including an integrated circuit, the die secured to the package substrate, and a stiffener ring secured to the package substrate and surrounding so as to define a perimeter around the die, where the stiffener ring increases a rigidity of the package substrate and delivers electrical power to the integrated circuit, where the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer. The method can further comprise facilitating delivery of electrical power from a power source at the PCB to an IC component of the die via the PWR plane of the stiffener ring.

The method can further comprise providing a layering section within the insulating layer of the stiffener ring to facilitate decoupling of the PWR plane and the GND plane, the layering section can comprise a plurality of first conductive sub-layers connected with the first conductive layer, a plurality of second conductive sub-layers connected with the second conductive layer and aligned in consecutively alternating rows with the first conductive sub-layers, and a plurality of insulating sub-layers connected with the insulating layer and located between so as to separate the consecutively alternating rows of the first conductive sub-layers and the second conductive sub-layers.

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure will now be described with more particular reference to the accompanying figures.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    a printed circuit board (PCB); and
    an integrated circuit (IC) package connected with the PCB, the IC package comprising:
        a package substrate;
        a die including an integrated circuit, the die secured to the package substrate; and
        a stiffener ring secured to the package substrate and surrounding so as to define a perimeter around the die, wherein the stiffener ring increases a rigidity of the package substrate and delivers electrical power to the integrated circuit, wherein the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer, wherein the first conductive layer, the second conductive layer and the insulating layer are arranged in a stacked manner in relation to each other and in relation to a mounting surface of the package substrate.

2. The apparatus of claim 1, wherein each of the first conductive layer, second conductive layer and insulating layer extends continuously along at least about 50% of an areal footprint defined by the perimeter of the stiffener ring around the die.

3. The apparatus of claim 2, wherein each of the first conductive layer, second conductive layer and insulating layer extends continuously along an entirety of the areal footprint defined by the perimeter of the stiffener ring around the die.

4. The apparatus of claim 1, wherein the stiffener ring has a polygon shape, and each of the first conductive layer, second conductive layer and insulating layer extends along at least one side of the stiffener ring.

5. The apparatus of claim 4, wherein each of the first conductive layer, second conductive layer and insulating layer extends along at least two sides of the stiffener ring.

6. The apparatus of claim 1, further comprising a layering section provided within the insulating layer, the layering section comprising a plurality of first conductive sub-layers connected with the first conductive layer, a plurality of second conductive sub-layers connected with the second conductive layer and aligned in consecutively alternating rows with the plurality of first conductive sub-layers, and a plurality of insulating sub-layers connected with the insulating layer and located between so as to separate the consecutively alternating rows of the plurality of first conductive sub-layers and the plurality of second conductive sub-layers.

7. The apparatus of claim 6, wherein consecutive rows of the plurality of insulating sub-layers are further connected to form a continuously extending insulating sub-layer structure that defines a winding path between pairs of consecutively aligned first and second conductive sub-layers.

8. The apparatus of claim 6, wherein each of the plurality of first conductive sub-layers, the plurality of second conductive sub-layers and the plurality of insulating sub-layers has a lengthwise dimension that extends parallel with a mounting surface of the package substrate upon which the stiffener ring is secured.

9. The apparatus of claim 6, wherein each of the plurality of first conductive sub-layers, the plurality of second conductive sub-layers and the plurality of insulating sub-layers has a lengthwise dimension that extends transverse a mounting surface of the package substrate upon which the stiffener ring is secured.

10. The apparatus of claim 1, wherein the first conductive layer is electrically coupled with a power supply of the PCB.

11. A networking device comprising the apparatus of claim 1.

12. An integrated circuit (IC) package comprising:
    a package substrate;
    a die including an integrated circuit, the die secured to the package substrate; and
    a stiffener ring secured to the package substrate and surrounding so as to define a perimeter around the die, wherein the stiffener ring increases a rigidity of the package substrate and delivers electrical power to the integrated circuit, wherein the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer, wherein the first conductive layer, the second conductive layer and the insulating layer are arranged in a stacked manner in relation to each other and in relation to a mounting surface of the package substrate.

13. The IC package of claim 12, wherein each of the first conductive layer, second conductive layer and insulating layer extends continuously along at least about 50% of an areal footprint defined by the perimeter of the stiffener ring around the die.

14. The IC package of claim 13, wherein each of the first conductive layer, second conductive layer and insulating layer extends continuously along an entirety of the areal footprint defined by the perimeter of the stiffener ring around the die.

15. The IC package of claim 12, wherein the stiffener ring has a polygon shape, and each of the first conductive layer, second conductive layer and insulating layer extends along at least one side of the stiffener ring.

16. The IC package of claim 15, wherein each of the first conductive layer, second conductive layer and insulating layer extends along at least two sides of the stiffener ring.

17. The IC package of claim 12, further comprising a layering section provided within the insulating layer, the layering section comprising a plurality of first conductive sub-layers connected with the first conductive layer, a plurality of second conductive sub-layers connected with the second conductive layer and aligned in consecutively alternating rows with the plurality of first conductive sub-layers, and a plurality of insulating sub-layers connected with the insulating layer and located between so as to separate the consecutively alternating rows of the plurality of first conductive sub-layers and the plurality of second conductive sub-layers.

18. The IC package of claim 17, wherein consecutive rows of the plurality of insulating sub-layers are further connected to form a continuously extending insulating sub-layer structure that defines a winding path between pairs of consecutively aligned first and second conductive sub-layers.

19. A method comprising:
providing an integrated circuit (IC) package for a printed circuit board (PCB) of an electronic device, the IC package comprising:
a package substrate;
a die including an integrated circuit, the die secured to the package substrate; and
a stiffener ring secured to the package substrate and surrounding so as to define a perimeter around the die, wherein the stiffener ring increases a rigidity of the package substrate and delivers electrical power to the integrated circuit, wherein the stiffener ring comprises a first conductive layer forming a power (PWR) plane for the integrated circuit, a second conductive layer forming a ground (GND) plane for the integrated circuit, and an insulating layer disposed between the first conductive layer and the second conductive layer, wherein the first conductive layer, the second conductive layer and the insulating layer are arranged in a stacked manner in relation to each other and in relation to a mounting surface of the package substrate; and
facilitating delivery of electrical power from a power source at the PCB to an IC component of the die via the PWR plane of the stiffener ring.

20. The method of claim 19, further comprising:
providing a layering section within the insulating layer of the stiffener ring to facilitate decoupling of the PWR plane and the GND plane, the layering section comprising a plurality of first conductive sub-layers connected with the first conductive layer, a plurality of second conductive sub-layers connected with the second conductive layer and aligned in consecutively alternating rows with the plurality of first conductive sub-layers, and a plurality of insulating sub-layers connected with the insulating layer and located between so as to separate the consecutively alternating rows of the plurality of first conductive sub-layers and the plurality of second conductive sub-layers.

* * * * *